US005932841A

United States Patent [19]

Matsumoto et al.

[11] Patent Number: 5,932,841

[45] Date of Patent: *Aug. 3, 1999

[54] CONNECTING STRUCTURE FOR METALLIC SHIELDING MEMBER

[75] Inventors: Mitsuhiro Matsumoto; Hidehiko Kuboshima; Hisaharu Katoh; Takeyuki Hamaguchi; Satoki Masuda, all of Haibara-gun, Japan

[73] Assignee: Yazaki Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/609,749

[22] Filed: Mar. 1, 1996

[30] Foreign Application Priority Data

Mar. 3, 1995 [JP] Japan .................................... 7-043978

[51] Int. Cl.$^{6}$ ...................................................... H05K 9/00

[52] U.S. Cl. ......................................... 174/35 C; 439/609

[58] Field of Search ............................... 174/35 C, 35 R; 439/607, 608, 609, 610; 361/816, 818

[56] References Cited

U.S. PATENT DOCUMENTS

| | | | |
|---|---|---|---|
| 4,290,663 | 9/1981 | Fowler et al. | 339/143 R |
| 5,064,388 | 11/1991 | Paladel | 439/607 |
| 5,433,618 | 7/1995 | Morlion et al. | 439/108 |
| 5,509,823 | 4/1996 | Hartling et al. | 439/607 |
| 5,584,718 | 12/1996 | Sukegawa | 439/352 |

FOREIGN PATENT DOCUMENTS

| | | |
|---|---|---|
| 58-381 | 1/1983 | Japan . |
| 60-19159 | 2/1985 | Japan . |
| 4-8278 | 1/1992 | Japan . |
| 4-129480 | 11/1992 | Japan . |
| 5-23458 | 3/1993 | Japan . |
| 5-34686 | 5/1993 | Japan . |
| 5-57779 | 6/1993 | Japan . |
| 6-251856 | 9/1994 | Japan . |
| 7-245153 | 9/1995 | Japan . |

*Primary Examiner*—Kristine Kincaid
*Assistant Examiner*—Hung V Ngo
*Attorney, Agent, or Firm*—Nikaido, Marmelstein, Murray & Oram LLP

[57] ABSTRACT

A connecting structure of a metallic shielding member is provided with each of contacting elongations in the leading edge direction of male or female metallic shielding member in which a pair of engaging hook pieces to engage with the contacting elongation of one of the metallic shielding members are formed at the contacting elongation of the other metallic shielding member. The pair of engaging hook pieces are formed at both sides of the slit provided between the adjacent contacting elongations. The other connecting structure of a metallic shielding member in which each of the contacting elongations of both metallic shielding members equipped with male and female connectors is brought into contact with each other, a pressing spring is provided for energizing the contacting elongation of one of the metallic shielding members toward the contacting elongation of the other metallic shielding member at least in the connector housing on one side. Furthermore, there are provided a contacting projection for both contacting elongations and an enlarged diameter portion for the contacting projection.

4 Claims, 10 Drawing Sheets

CONNECTING STRUCTURE FOR METALLIC SHIELDING MEMBER

BACKGROUND OF THE INVENTION

1. Field of the Invention

This invention relates to a connecting structure for a metallic shielding member which shields electric noises is intended to come into surely contact with a male metallic shielding member and a female metallic shielding member.

2. Description of the Prior Art

FIGS. 9 to 11 show a conventional shielded connector as proposed in the Japanese Patent Application Laid-Open No. Hei 7-245153.

A female side connector 19 shown in FIG. 9 comprises a female connector housing 17 made of synthetic resin, a female side metallic shielding member 3 and a male terminal 25. The female connector housing 17 has a cylindrical inner housing 27 at an inside of an outer housing 26 through a coupling portion 28. An annular shield inserting gap 29 is formed between the outer housing 26 and the inner housing 27, an inserting hole 30 toward a contacting elongation 4 in the leading edge direction of the metallic shielding member 3 is formed at the coupling portion 28.

The metallic shielding member 3 is a cylindrical form, and the contacting elongation 4 divided four-part is provided at the leading edge of the cylindrical portion 31. Each of the contacting elongations 4 is adjacent to each other through a wide slit 15. An engaging piece 33 toward a connecting recess 32 of the inner housing 27 is formed at the inside of the contacting elongation 4. A bottom end **15*a* of the slit 15 comes into contact with a rear end of the coupling portion 28**.

A male terminal 25 is arranged within the metallic shielding member 3, and the male terminal 25 is connected to a shielded electric wire 34. A base 35 of the metallic shielding member 3 is connected to a shield conductor 36 of the shielded electric wire 34.

Moreover, a male side connector 37 shown in FIG. 10 is composed of a male connector housing 12, male side metallic shielding member 38 and a female terminal 39, according to an engagement between both connectors 19 and 37, the male side metallic shielding member 38 is inserted into the female side metallic shielding member 31 at the same time that a male terminal 25 and a female terminal 39 are connected to each other.

The male connector housing 12 has an annular shield insertion gap 20 between an outer housing 13 and an inner housing 14 the same as above description. The male side metallic shielding member 38 has a contacting elongation for contacting 42 divided into four part by a slit 41 at the leading edge of a cylindrical part 40. The contacting elongation 42 projects forward from the insertion hole 22 of the coupling portion 21 between the inner housing 14 and the outer housing 13 through the shield insertion gap 20. An engaging piece 43 on the inside of the cylindrical portion 40 engages with a connecting groove 16 of the inner housing 14 at the same time of the above projection of the contacting elongation 42.

FIG. 11 shows a connecting condition of both of metallic shielding members 3, 38. Four pieces of the contacting elongations 4, 42 of each of metallic shielding members 3, 38 come into contact with each other with made overlapping alternately on the other side slits 41, 15.

However, in the above conventional connecting structure of the metallic shielding member, at the beginning of connecting both of the contacting elongation 4, 42 are coming into closely contact with each other, there are some apprehensions that it becomes susceptible to be generated bad contact since a contacting pressure between both contacting elongations 4, 42 get weak with time in that the contacting elongations 4, 42 wear away according to vibration of the vehicle and so force or the male side contacting elongation 4 is forced to deform with opened outward.

SUMMARY OF THE INVENTION

In view of the foregoing, it is an object of the present invention to provide a connecting structure for a metallic shielding member which can prevent an occurrence of bad contact thereof even if the vehicle vibrates.

According to the first aspect of the present invention, for achieving the above-mentioned object, there is provided a connecting structure for a metallic shielding member in which a contacting elongation in a leading edge direction of a cylindrical male metallic shielding member is forced to come into contact with a mating contacting elongation in a leading edge direction of a cylindrical female metallic shielding member wherein a pair of engaging hook pieces toward the contacting elongation of the metallic shielding member on one side are formed at the contacting elongation of the metallic shielding member on the other side. It is also possible in the above described structure wherein the pair of engaging hook pieces are formed at both sides of the slit provided between the adjacent contacting elongations with each other.

According to the second aspect of the present invention there is provided a connecting structure for a metallic shielding member in which it causes a connector equipped with the male side metallic shielding member and a mating connector equipped with the female side metallic shielding member to engage with each other, while coming into contact with the contacting elongations in the leading edge direction of both metallic shielding members mutually wherein a pressing spring portion which permits the contacting elongation either of the metallic shielding members to energize toward the mating contacting elongation of the other metallic shielding member is provided for at least a housing of the connector on one side.

According to the third aspect of the present invention there is provided a connecting structure for a metallic shielding member in which a contacting elongation in a leading edge direction of a cylindrical male metallic shielding member equipped with a male connector is forced to come into contact with a mating contacting elongation in a leading edge direction of a cylindrical female metallic shielding member equipped with a female connector wherein a contacting projection is formed at the contacting elongation of the metallic shielding member on one side, said contacting projection comes into contact with the mating contacting elongation of the metallic shielding member on the other side in case of engagement between the male connector and the female connector. It is also possible in the above described third aspect wherein an enlarged diameter portion is provided for the contacting elongation of the female side metallic shielding member whereby contacting projection is forced to come into contact with contacting elongation at the enlarged diameter portion.

As stated above, the contacting structure for the metallic shielding member according to the first aspect of the present invention is provided with the contacting elongation of the female side metallic shielding member joining and making overlapping to the mating contacting elongation of the male side metallic shielding member at the same time of engagement for both connectors. At this time, the contacting elongation (for example female side) on one side is inserted into the gap between a pair of engaging hook pieces, and is maintained with joined to the peripheral surface of the contacting elongation (for example male side) on the other side by means of the engaging hook piece.

Further, the contacting structure for the metallic shielding member according to the second aspect of the present invention there is provided the pressing spring portion which causes the contacting elongation of the metallic shielding member on one side to join with pressurized to the contacting elongation of the metallic shielding member on the other side at the same time of engagement for both connectors.

Furthermore, the contacting structure for the metallic shielding member according to the third aspect of the present invention there is provided the contacting projection in which each contacting elongation of both metallic shielding members is certainly connected by virtue of high contacting pressure of point contact of the contacting projection, since the contacting projections are positioned on the inside of the enlarged diameter portion, both of the contacting elongations are adjacent to each other.

The above and further objects and novel features of the invention will be more fully understood from the following detailed description when the same is read in connecting with the accompanying drawings. It should be expressly understood, however, that the drawings are for purpose of illustration only and are not intended as a definition of the limits of the invention.

DETAILED DESCRIPTION OF THE PREFERRED EMBODIMENTS

Preferred embodiments of the invention will now be described in detail referring to the accompanying drawings.

Figure 1:
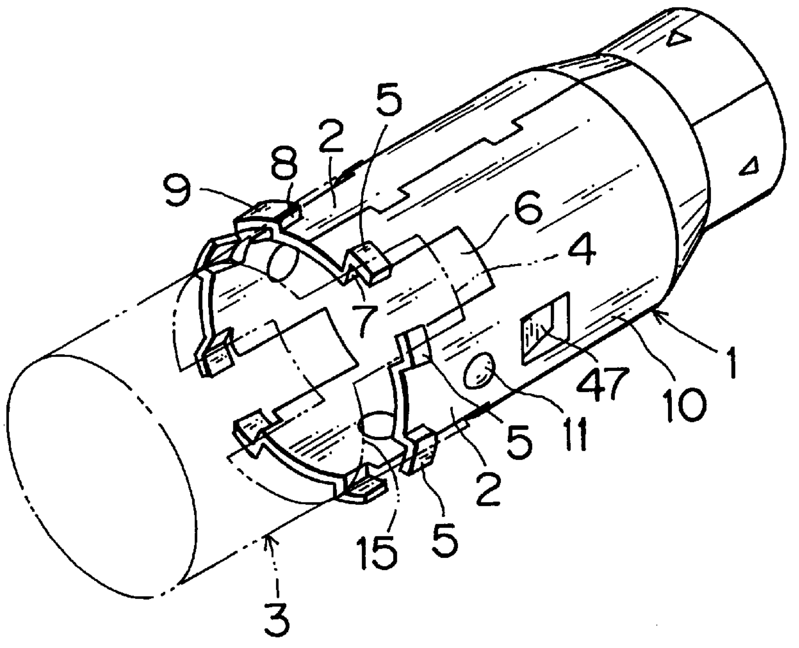
FIG. 1 is a perspective view showing a connecting structure of a metallic shielding member according to the first embodiment of the present invention.
Figure 2:
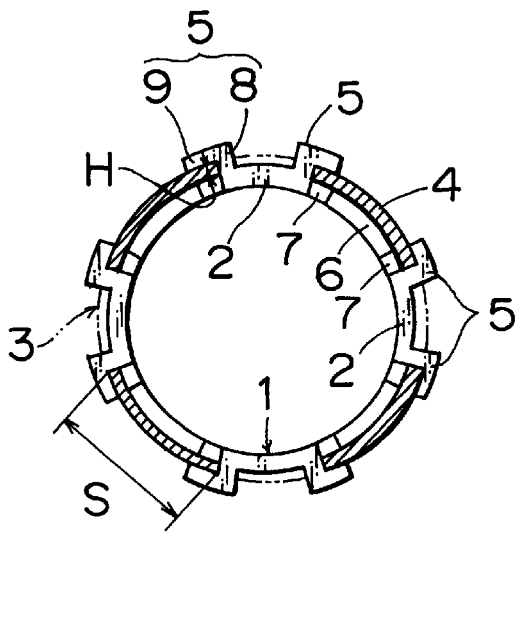
FIG. 2 is a longitudinal sectional view showing a connecting condition of the same as above FIG. 1.

FIGS. 1 and 2 show a connecting structure of a metallic shielding member according to the first embodiment of the present invention.

The connecting structure is characterized in that it causes each pair of engaging hook piece 5 toward a contacting elongation 4 of the other female side metallic shielding member 3 to form at a contacting elongation 2 divided into four parts in the leading edge of a male side metallic shielding member 1.

The pair of engaging hook pieces 5, 5 are formed at both sides of the wide slit 6 between the contacting elongations 2, 2 adjacent thereto, and are composed of a rising portion 8 which is protruded to a shield external diameter direction from slightly notched position, from the leading edge of the contacting elongation 2 to the width direction (circumferential direction) of the contacting elongation 2, and a circular arc shaped supporting portion 9 protruded to slit width direction from the leading edge of the rising portion 8.

A projection height H of the rising portion 8 is established the same numerical value as thickness of the board of the contacting elongation 4 of the male side metallic shielding member 3 or only less than thereof. An index of curvature of the circular arc shaped supporting portion 9 is established so as to agree approximately with an index of curvature of the contacting elongation 4 of the female metallic shielding member 3. A depth of the notching 7 is established so as to become in that an inner width S between the rising portions 8 of the pair of engaging hook piece 5, 5 are some larger than the width of the contacting elongation 4. It should be added downward (direction for the center of metallic shielding member) energized force by means of the spring to the annular arc shaped supporting portion 9.

The contacting elongation 4 of the female side metallic shielding member 3 is joined to the peripheral surface of a cylindrical portion 10 of the male side metallic shielding member 1 with inserted into the inside of the pair of engaging hook pieces 5, 5 faced each other with put the slit 6 therebetween. The annular arc shaped supporting portion 9 is joined to the outer surface of the contacting elongation 4 of the female side metallic shielding member 3 so that it causes the contacting elongation 4 to press always against the center of the metallic shielding member 1. For this reason, even if both metallic shielding members 1, 3 are forced to vibrate with both metallic shielding members 1, 3 connected, contact pressure of both contacting elongations 2, 4 are not weakened.

Figures 3, 3A:
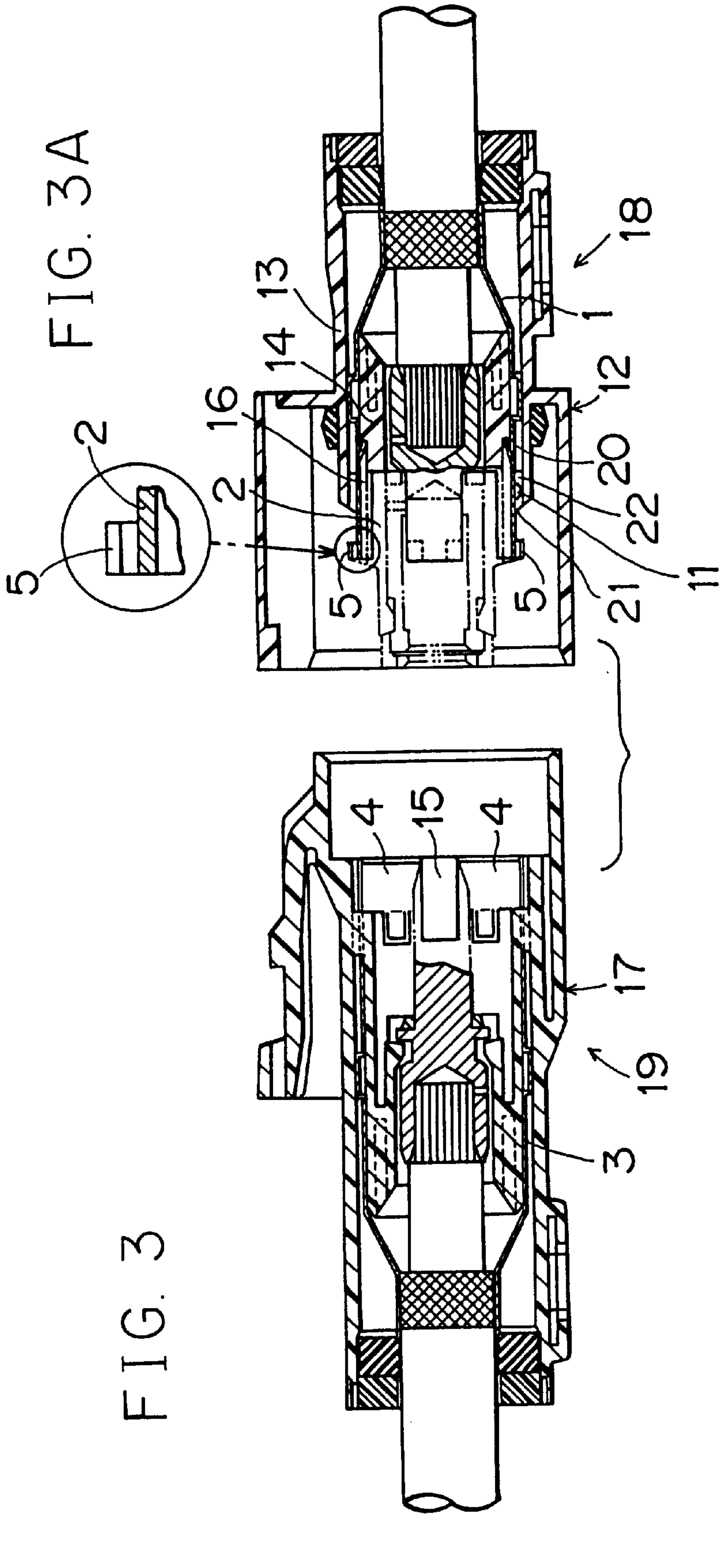
FIG. 3 is a longitudinal sectional view showing a male connector and a female connector equipped with metallic shielding members.

In FIG. 1, a projection 11 which is formed protrusively at the outer side center of the contacting elongation 2 is a backlash preventing projection joined to an inner wall of the male connector housing 12 (outer housing 13) of FIG. 3. The backlash preventing projection 11 is positioned within the slit 15 between the contacting elongations 4 of the other female side metallic shielding member 3. Further an engaging piece 47 toward a connecting groove 16 of an inner housing 14 (referring to FIG. 3) is formed at the cylindrical portion 10 in the rear direction of the backlash preventing projection 11.

Figures 4, 4A:
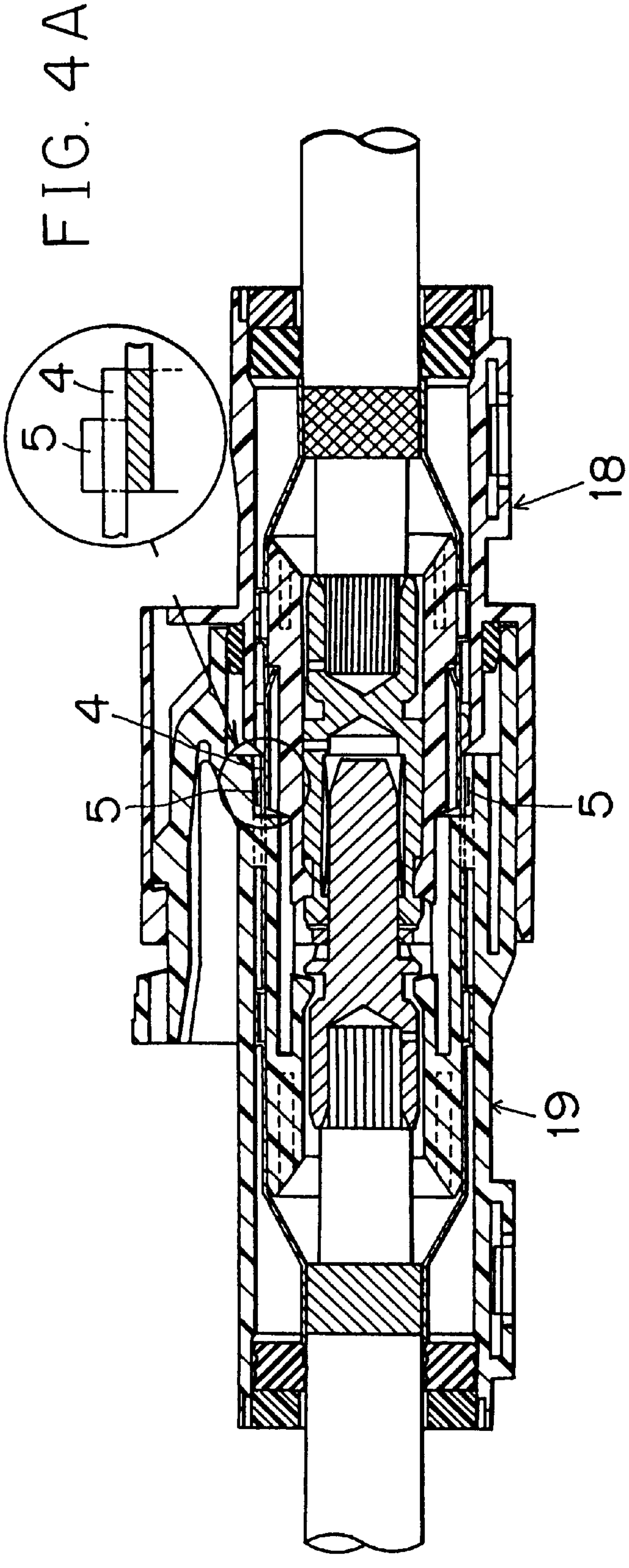
FIG. 4 is a longitudinal sectional view showing a connecting condition of the female and male connectors of FIG. 1.

FIG. 3 shows a condition that it causes the male and the female metallic shielding members 1, 3 to attach to the connector housings 12, 17 respectively. FIG. 4 shows a condition that it causes the male connector 18 to engage with the female connector 19. The structure of each of connector housing 12, 17 and the female side metallic shielding member 3 are the same as the conventional one accordingly the descriptions of the common parts are omitted here to avoid unnecessary repetition.

In FIG. 3, the male side metallic shielding member 1 is inserted into the annular shield insertion gap 20 of the male side connector housing 12. The contacting elongation 2 protrudes forward passing through the insertion hole 22 of the coupling portion 21 between the inner housing 14 and the outer housing 13. The outer surface of the contacting elongation 2 is exposed to the outer side of the inner housing 14. The engaging hook piece 5 is positioned protrusively at the leading edge of the contacting elongation 2.

The contacting elongation 4 of the female side metallic shielding member 3 is inserted into the inside of the engaging hook piece 5 at the same time of the engagement for both connectors 18 and 19 as shown in FIG. 4, and is joined on the outer surface of the contacting elongation 2 of the male side metallic shielding member 1. The condition of intimate contact between the contacting elongation 4 of the female side metallic shielding member 3 and the contacting elongation 2 of the male side is maintained by the engaging hook piece 5, as a result thereof, the contacting elongation 4 is connected with the male side contacting elongation 2 with a stabilized contact pressure without looseness occurring with time.

In the above described embodiment, it causes the engaging hook piece 5 to provide protrusively at the periphery side of the male side metallic shielding member 1, however there are possibilities that it causes the engaging hook peace 5 to provide protrusively at the inside of the female side metallic shielding member 3 in some shapes, and that it causes the contacting elongations of the male and the female metallic shielding members to make overlapping with each other at the same position without the phase deviation thereof toward the circumferential direction.

Figure 5A:
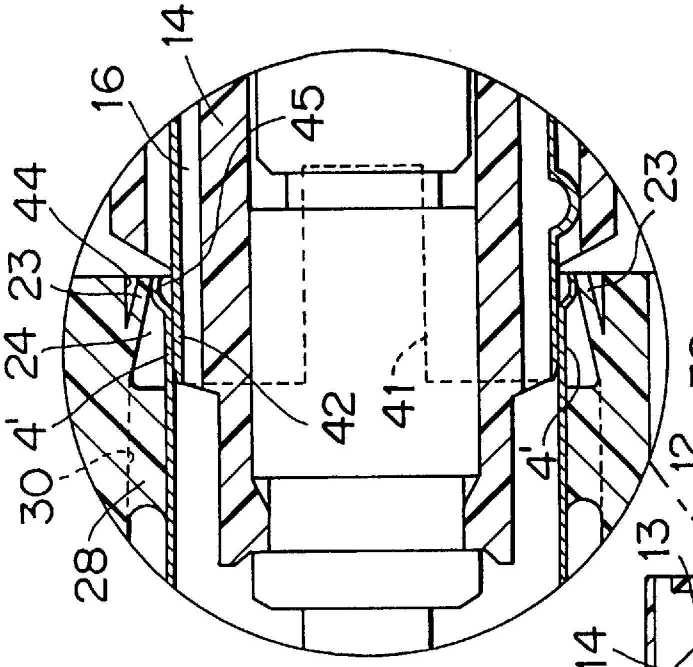
FIG. 5 is a perspective view showing a connecting structure of a metallic shielding member according to the second embodiment of the present invention.
Figure 5:
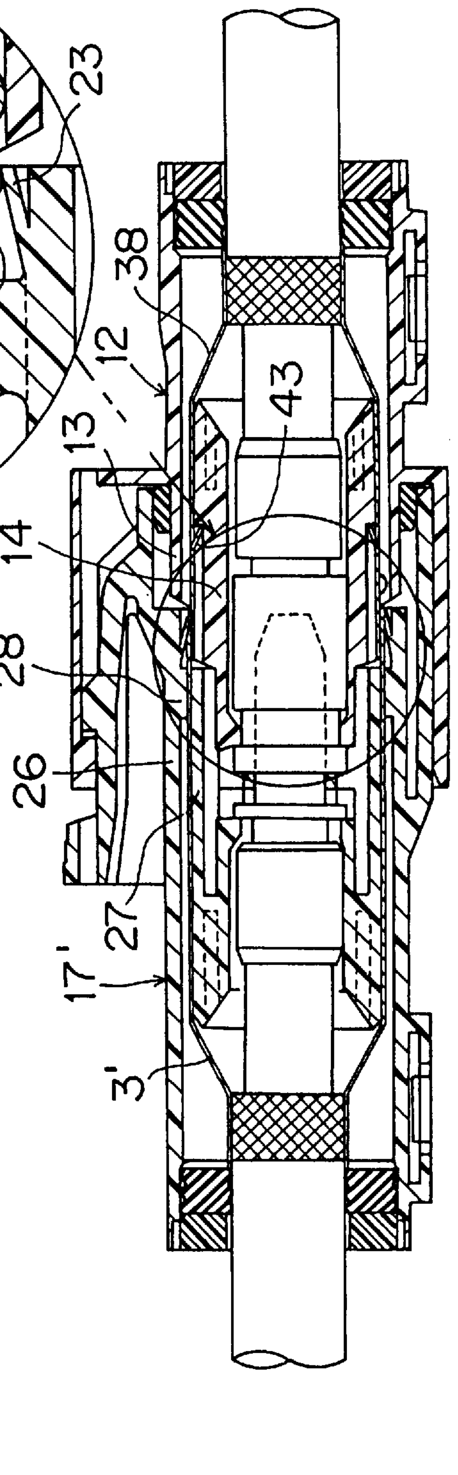

FIG. 5 shows a connecting structure of a metallic shielding member according to the second embodiment of the present invention. This structure is characterized in that it causes a pressing spring piece 23 opposite to the other party contacting elongation 4' of the female side metallic shielding member 3' to form integrally at the male connector housing 17' equipped with the female side metallic shielding member 3'.

The pressing spring piece 23 is formed protrusively toward diagonally forward from the inner wall 44 of the vacant room 24 in front of the coupling portion 28 between the inner housing 27 and the outer housing 26. The pressing spring pieces 23 are positioned in front of the shield inserting hole 30 of the coupling portion 28 corresponding to the four pieces of contacting elongations 4'.

An annular projection 45 protruded toward outward is formed at the leading edge of the female side contacting elongation 4'. The leading edge portion of the pressing spring piece 23 comes into contact with the annular projection 45 with energized. The contacting elongation 42 of the male side metallic shielding member 38 is mounted on the inside of the male connector housing 12, and the male side contacting elongation 42 is inserted into the inside of female side contacting elongation 4'. The female side contacting elongation 4' is made overlapping with the contacting elongation 42 on the slit 41 of the male side metallic shielding member 38 same as above example. The male side contacting elongation 42 comes into contact with the upper part of the inner housing 14 which has a connecting groove 16 to the engaging piece 43.

The female side contacting elongation 4' is joined to the male side contacting elongation 42 by energizing force of the pressing spring piece 23 pressing toward the inside direction. Although the contacting elongation 4' wears away by vibration of vehicle, the pressing spring piece 23 always permits the female side contacting elongation 4' to press against the male side contacting elongation 42 accordingly certain contacting pressure is maintained. The pressing spring piece 23 prevents the deformation toward outwardly of the female side contacting elongation 4'.

In the above described second embodiment, it causes the pressing spring piece 23 to form integrally with the connector housing 17' however, it is effective to provide a pressing spring piece made of metal (not shown) for the connector housing 17' separately. Further it is possible to provide a pressing spring piece to the contacting elongation 4' of the female side metallic shielding member 3' for the outer housing 13 of the male connector housing 12 with the male side metallic shielding member 38 rather than the female connector housing 17' with the female side metallic shielding member 3'. Furthermore, it is possible to provide a pressing spring piece which comes into contact with the inside surface of the male side contacting elongation 42 for the position of the connecting groove 16 of the inner housing 14 of the male connector housing 12 in FIG. 5.

Figure 6:
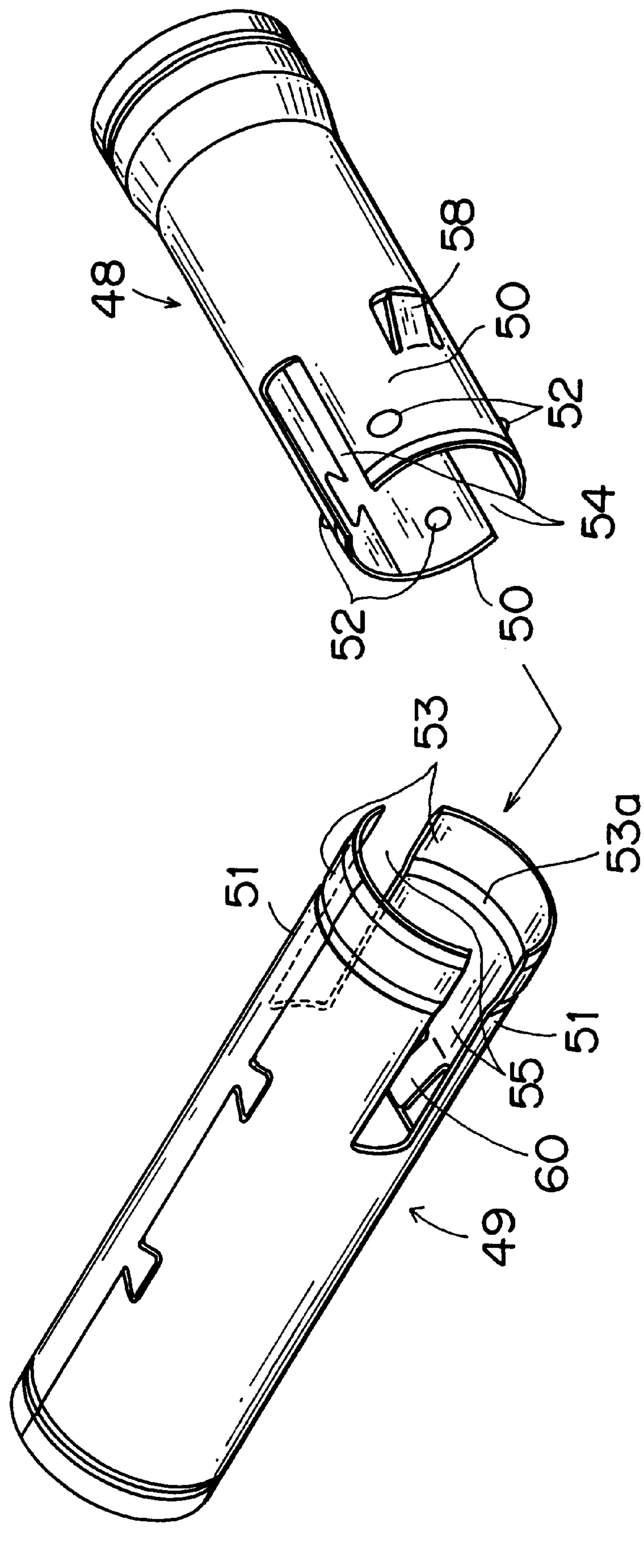
FIG. 6 is an exploded perspective view showing a connecting structure of a metallic shielding member according to the third embodiment of the present invention.
Figure 7A:
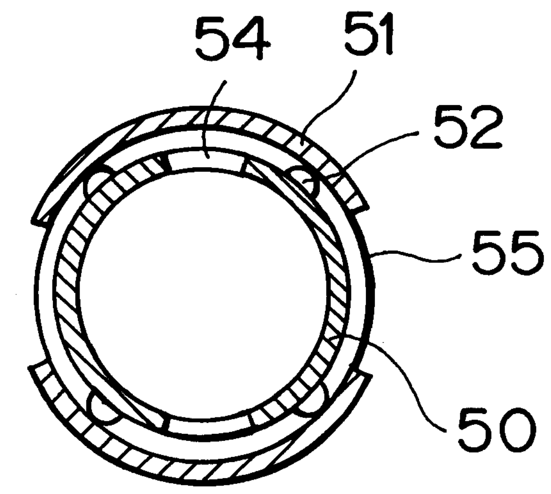
FIG. 7A is a longitudinal sectional view showing a connecting condition of FIG. 6.
Figure 7B:
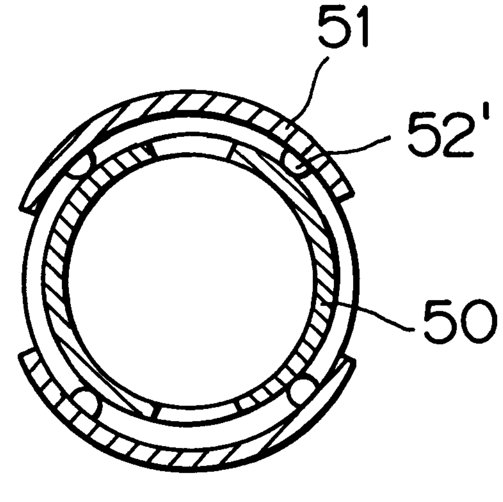
FIG. 7B is a longitudinal sectional view showing a transformational example of FIG. 6.
Figure 8:
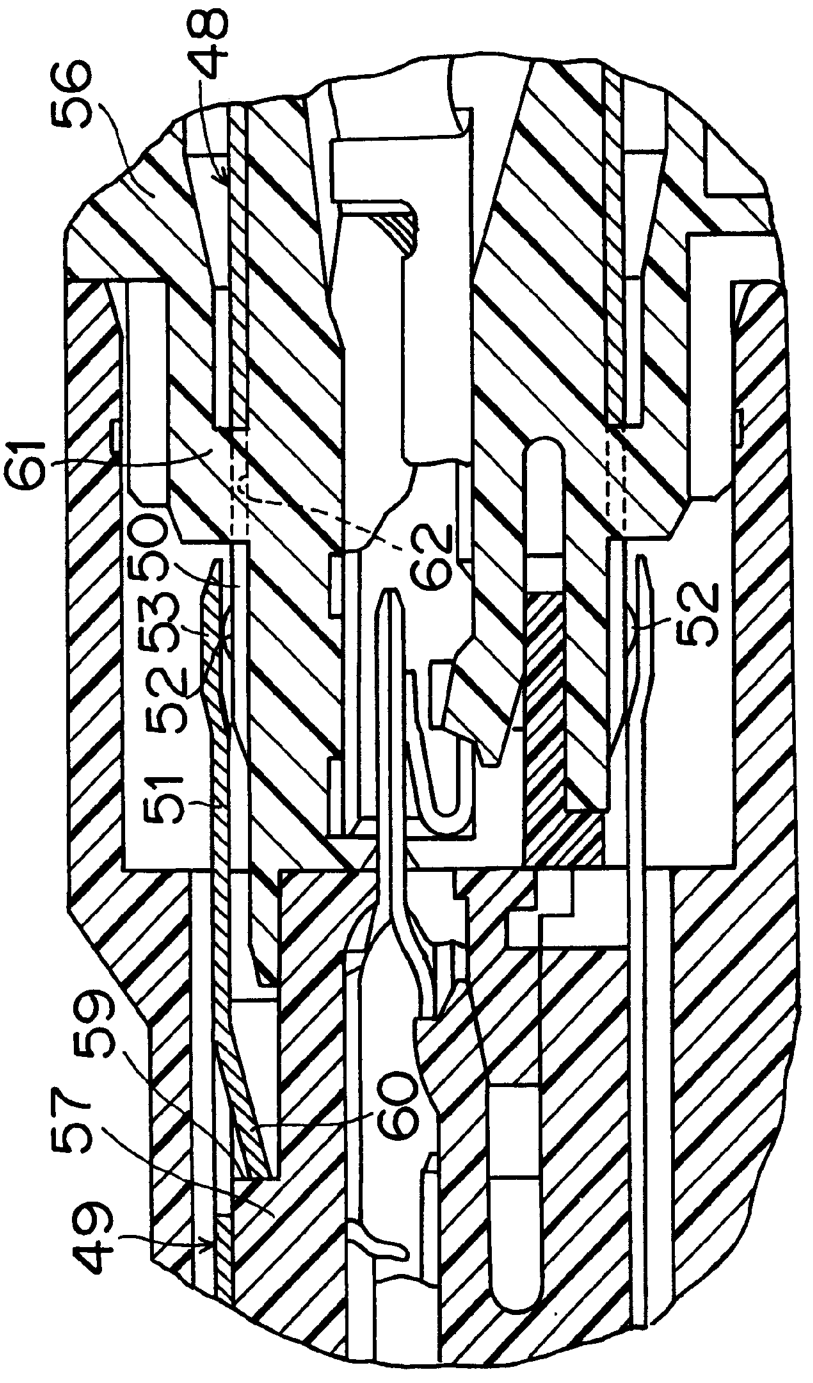
FIG. 8 is a longitudinal sectional view showing a connecting condition of the female and male connectors of FIG. 6.
Figure 9:
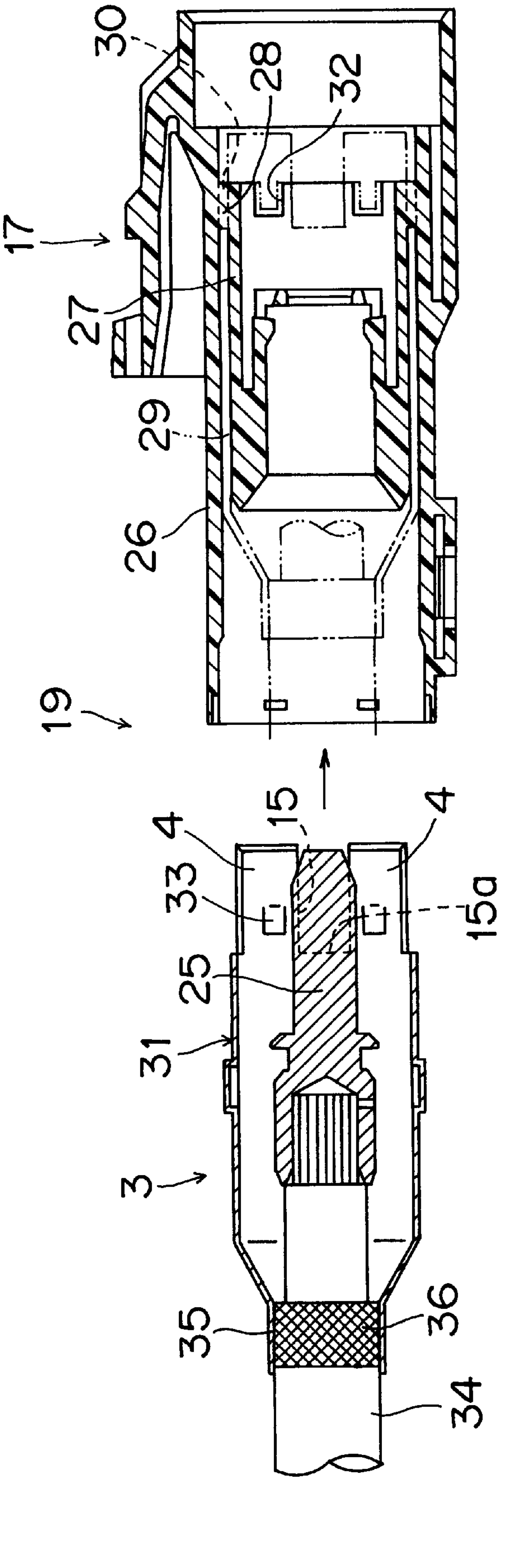
FIG. 9 PRIOR ART
FIG. 9 is a longitudinal sectional view showing a condition in which it causes the conventional female side metallic shielding member to mount on the housing.
Figure 10:
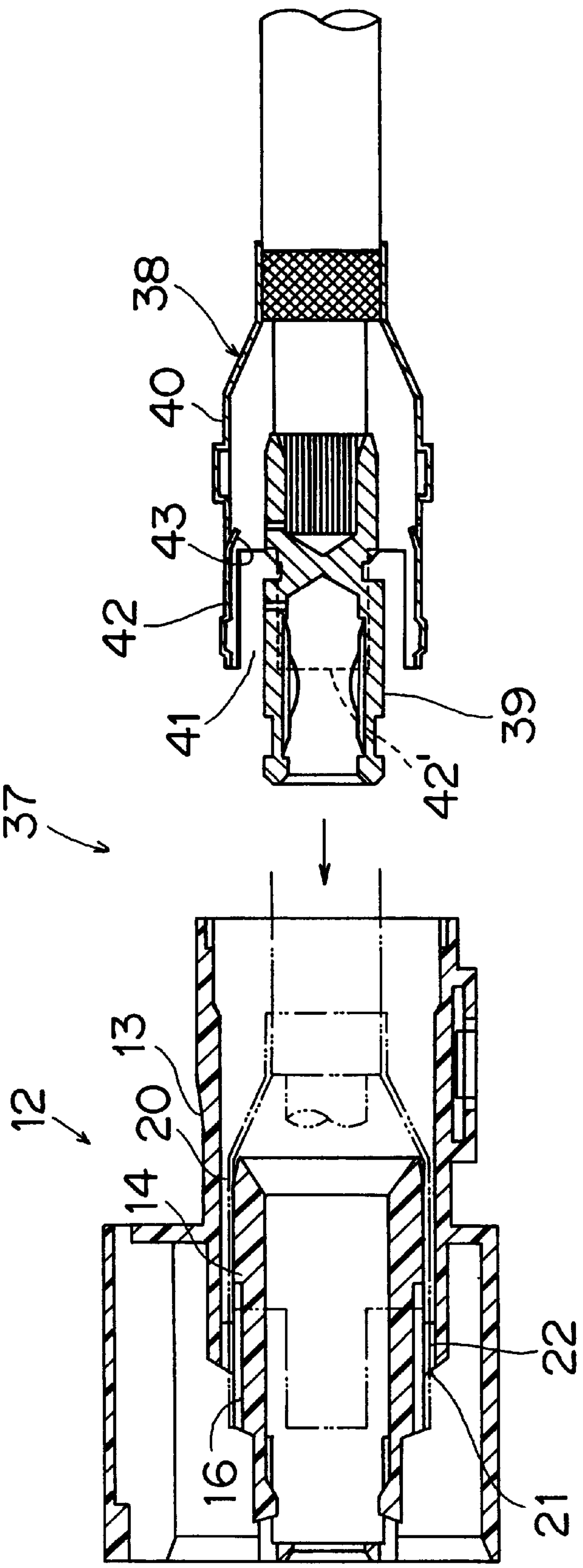
FIG. 10 PRIOR ART
FIG. 10 is a longitudinal sectional view showing a condition in which it causes the male side metallic shielding member to mount on the housing.
Figure 11:
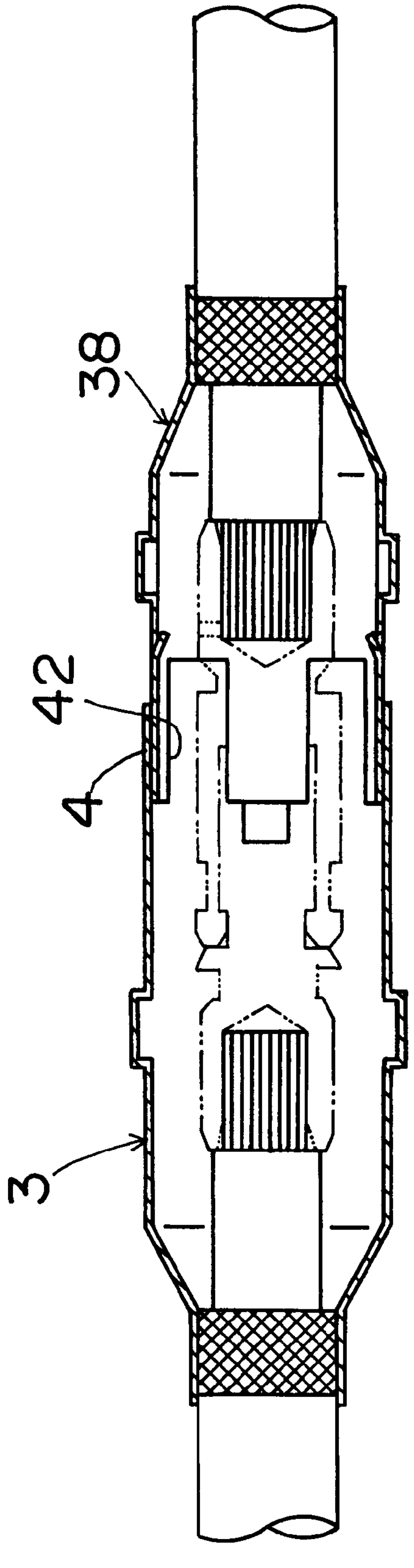
FIG. 11 PRIOR ART
FIG. 11 is a longitudinal sectional view showing a connecting condition of a conventional metallic shielding member.

FIGS. 6 to 8 show a connecting structure for the metallic shielding member according to the third embodiment of the present invention.

This structure permits the contacting property between the metallic shielding member 48 and the metallic shielding member 49 to improve. It causes a plurality of hemispheric contacting projection 52 to form protrusively at the peripheral surface of the leading edge direction of the contacting elongation 50 of the male side metallic shielding member 48, and it causes an annular enlarged diameter portion for contact 53 to the contacting projection 52 to form at the leading edge direction of the female side metallic shielding member 49.

The metallic shielding member 48 has a pair of wide slits 54 opposite to each other along the length, and the metallic shielding member 49 has a pair of wide slits 55 opposite to each other along the length. It causes a pair of contacting elongations 50, 51 which have approximately half-round sectional form in the circumferential direction of 90° to the slits 54, 55 respectively. The contacting projections 52 are formed equally separated 90° in the leading edge direction of the contacting elongation 50. The rigidity of the pair of contacting elongations 50, 51 is higher than that of the above described four pieces of the contacting elongations for example of 42 in FIG. 5. The male side contacting elongations 50 which have strong outwardly elastic reaction force are virtually unbendable inward, and the female side contacting elongations 51 are virtually unbendable outward. Consequently, the male side and the female side contacting elongations have higher pressing pressure than the four pieces of the contacting elongations as described above.

The inner circumferential surface of the enlarged diameter portion for contact 53 extends in a straight line along the length from the leading edge of the contacting elongation 51, a taper shaped portion 53a is formed at the base of the enlarged diameter portion 53. An engaging piece 58 to the male connector housing 56 of FIG. 8 is notched outward at the base side of the contacting elongation of the male side metallic shielding member 48, and an inward engaging piece

60 to the connecting step portion 59 of the female connector housing 57 is formed at the base side of the contacting elongation 51 of the female side metallic shielding member 49.

As shown in FIG. 7A, the slit 54 of the metallic shielding member 48 is forced to deviate only 90° from the slit 55 of the metallic shielding member 49 in the circumferential direction so that the side portion of the contacting elongation 50 overlaps that of the contacting elongation 51, as a result thereof, as shown in FIG. 8, the contacting projection 52 of the male side metallic shielding member 48 comes into pressurized contact with the inner circumferential surface of the enlarged diameter portion 53 of the female side metallic shielding member 49.

As shown in FIG. 7B, it is possible to adopt the structure in which it causes a contacting projection 52' to form protrusively at the inner side surface of the contacting elongation 51 of the female side metallic shielding member 49 rather than the male side metallic shielding member 48, and to come into connectively contact with the contacting elongation 50 of the male side metallic shielding member 48. In this case, it is desirable that the contacting projection 52' is formed at the enlarged diameter portion 53 (referring to FIG. 6) of the female side metallic shielding member 49. It is capable of maintaining the high shielded property in that the contacting projection 52 or 52' which is positioned within the enlarged diameter portion 53 comes into contact with the contacting elongations 50, 51 of both of the metallic shielding members.

In FIG. 8, each of the pair of contacting elongations 50, 51 are protruded forward, with inserted into a shield insertion hole 62 positioned at a pair of coupling portion 61 connecting between the inner housing and the outer housing of the connector housings 56, 57. The shield insertion hole of the female connector housing 57 is faced toward the shield insertion hole 62 of the connector housing 56, with deviated 90° in the circumferential direction.

As described above, according to the present invention, since the engaging hook piece or the pressing spring portion causes the contacting elongation of one side metallic shielding member to come into pressurized contact with the contacting elongation of the other side of the metallic shielding member, although the contacting elongation wear away by vibration of vehicle, the contacting elongations certainly come into contact with each other. The deformation toward the shield diameter direction of the contacting elongation by vibration is prevented, thereby a deterioration with time of contact pressure for the mutual contacting elongation is prevented. Bad contact between both metallic shielding members does not take place so that good shielded property is always exhibited. Further by forming the contacting projection at the contacting elongation, both metallic shielding members are capable of being connected certainly with strong contact pressure by the point contact of the contacting projection.

What is claimed is:

1. A connecting structure for metallic shielding members comprising:

a male contacting elongation formed at a front end portion of a cylindrical male metallic shielding member mounted on a male connector, and extending rearward from a leading edge of said male metallic shielding member;

a female contacting elongation formed at a front end portion of a cylindrical female metallic shielding member mounted on a female connector, extending rearward from a leading edge of said female metallic shielding member, and shaped to be electrically connected to said male contacting elongation;

a contacting projection formed on one of said male contacting elongation and said female contacting elongation, said contacting projection being brought into contact with the other one of said male contacting elongation and said female contacting elongation at a time of engagement between said male and said female connectors;

a single pair of symmetrically arranged longitudinal slits formed on each of said male and female contacting elongations so as to make said male and female contacting elongations flexible with keeping strong contact pressure between the other one of said male contacting elongation and said female contacting elongation and said contacting projection, said pairs of longitudinal slits being arranged relative to each other with a difference of 90 degrees in a circumferential direction so as to define overlapping portions on both sides of all metal portions of said male and female contacting elongations without leaving a radial opening when engaged, thereby attaining sure shielding effect; and an enlarged-diameter portion formed at a front end of said female contacting elongation, extending rearwardly from said leading edge, and having a larger diameter than a diameter of a remainder of said female contacting elongation and a uniform circular cross-section in a direction of a longitudinal axis of said female metallic shielding member so as to dispose said contacting projection between said enlarged-diameter portion and said male contacting elongation;

whereby said male and female metallic shielding members are surely electrically connected to each other along with sure shielding effect.

2. The connecting structure according to claim 1, wherein said contacting projection is in a substantially hemispheric shape.

3. The connecting structure according to claim 2, wherein said overlapping portions each are provided with said contacting projection.

4. The connecting structure according to claim 1, wherein said overlapping portions each are provided with said contacting projection.

* * * * *